United States Patent [19]
Ishii

[11] Patent Number: 5,896,322
[45] Date of Patent: Apr. 20, 1999

[54] MULTIPLE-PORT RING BUFFER

[75] Inventor: Takatoshi Ishii, Sunnyvale, Calif.

[73] Assignee: S3 Incorporated, Santa Clara, Calif.

[21] Appl. No.: 08/956,710

[22] Filed: Oct. 23, 1997

[51] Int. Cl.[6] .................................................. G11C 13/00
[52] U.S. Cl. ............................... 365/189.04; 365/189.01
[58] Field of Search ............................. 365/73, 189.01, 365/189.04, 189.05, 230.03

[56] References Cited

U.S. PATENT DOCUMENTS 4,303,986  12/1981  Lans ............................ 365/189.01

*Primary Examiner*—Terrell W. Fears
*Attorney, Agent, or Firm*—Fenwick & West LLP

[57] ABSTRACT

A computer graphics subsystem according to a preferred embodiment of the present invention has a video digital signal processor (VDSP) that normally requires a plurality of discrete field and line memories, but, instead, is adapted to use multiple-port ring buffers (MPRBs) in an internal memory and/or an external display memory. Each MPRB comprises a plurality of addressable storage location holding video data and linked in a logical ring configuration. In addition, each MPRB has at least three ports, selected from write ports for writing to the addresses of the storage locations and read ports for reading from the addresses. Each read port in the MPRB is disposed a certain distance, or number of storage locations, behind a write port. This distance defines the size of the memory emulated by the MPRB. By positioning multiple read ports at different distances from the write ports, a single MPRB can emulate several different memories of different sizes. Since a write port needs to write the video data to the MPRB only once and the data need not be moved within the MPRB, the memory bandwidth consumed by the MPRB is substantially less than that required by the discrete memories.

19 Claims, 6 Drawing Sheets

MULTIPLE-PORT RING BUFFER

BACKGROUND OF THE INVENTION

1. Field of the Invention

This invention pertains in general to digital signal processing and in particular to data structures for storing portions of the digital video signal during processing.

2. Description of Background Art

Modern computer systems have graphics processing subsystems capable of processing video signals as well as graphics commands. Video signals contain many frames of video data and are typically generated by devices like television tuners and Motion Pictures Expert Group (MPEG) decoders. Graphics commands, in contrast, are data specifying drawing instructions and typically arrive from the central processing unit of the computer system.

Video signals undergo a large amount of processing before display. First, the video signals are converted from either the NTSC or PAL formats into the format used by the video processor. Then, the video signals are processed to improve the picture quality. For example, television signals are interlaced and typically of a much lower resolution than that supported by the computer system display and must be de-interlaced by replicating vertical lines to make the picture appear to keep a normal aspect ratio on the display. Complex digital signal processing (DSP) techniques are used to replicate lines without generating undesirable display artifacts.

In order to perform this DSP, a graphics processing subsystem of a computer system usually has an engine dedicated to video DSP (VDSP). The engine has a number of sub-units, with each sub-unit performing one or more of the various VDSP functions. Many of the sub-units use discrete line memories, each holding a line of video data, and discrete field memories, each holding one-half of a frame of video data.

Implementing a VDSP in a graphics processing subsystem is difficult because the discrete memories require high memory capacity and wide printed circuit board space. Moreover, the data interface between the discrete memories requires more pins than can be implemented in a single VLSI circuit. As a result, there is a desire to allocate the discrete memories into the display memory already present in the graphics processing subsystem and implement the VDSP in a very large scale integrated (VLSI) circuit.

However, the bandwidth required by the combined memories is prohibitively high. For example, the FAROUDJA VP250/LD200 VDSP system manufactured by FAROUDJA LABORATORIES of Sunnyvale, Calif., requires five discrete field memories and 17 discrete line memories. The total capacity of these memories is approximately 1.3 megabytes (MB). Since each memory has a read port and a write port, there are 44 total input and output ports and the total memory data interface bus is 208 bits in this example. In addition, the operating clock frequency is 13.5 Megahertz (MHz) for the five field memories and 13 line memories and 27 MHz for four line memories. Accordingly, the total memory bandwidth is 715 MB/second. This bandwidth exceeds the maximum speed of the graphics processing subsystem display memory.

Accordingly, there is a need for a way to replace the multiple discrete memories required by the VDSP with a local internal memory and an external general purpose memory while reducing the total required bandwidth to achievable levels. The local internal memory would be located within the VDSP for performance reasons and the external general purpose memory would be incorporated into the inexpensive, fast, external display memory already present in the graphics processing subsystem.

SUMMARY OF THE INVENTION

The above needs are met by a computer graphics subsystem having a video digital signal processor (VDSP) engine adapted to use multiple-port ring buffers (MPRBs) emulating discrete line and field memories. The MPRBs are held in both a memory internal to the VDSP and a VDSP memory buffer in an external display memory. Each MPRB comprises a block of addressable memory, where each memory address is adapted to hold video data. In addition, each MPRB has at least three ports selected from between write ports for writing to the addresses and read ports for reading from the addresses. The ports are adapted to increment through the addresses in a ring configuration. Thus, when a port reaches the last address in a block, it returns to the first address.

Each read port in the ring is disposed a certain distance behind the write port. This distance, along with the amount of video data held at each address, defines the size of the discrete memory or memories emulated by that particular read port. By positioning multiple read ports at different distances from the write port and accounting for the amount of video data held at each address, a single MPRB can emulate different discrete memories of different sizes. Since the write port needs to write the video data to the MPRB only once and the data need not be moved within the memory, the memory bandwidth consumed by the MPRB is substantially less than that required by the discrete memories.

The discrete LUMA and CHROMA memories used by the VDSP each comprise a field memory coupled in series to a line memory and another field memory. The present invention uses a MPRB having one write port and three read ports to emulate the LUMA and CHROMA memories. The first read port is positioned a field memory away from the write port, the second read port is positioned a line memory away from the first read port, and the third read port is positioned a field memory away from the second read port. After writing to or reading from the respective addresses, the ports each increment to the next address. Accordingly, the distances between the ports stay constant and the values at the ports emulate the discrete LUMA and CHROMA memories.

The video motion memory used by the VDSP includes a field memory coupled to a line memory and is emulated by a MPRB having one write port and two read ports. The first read port is positioned a field memory away from the write port and the second read port is positioned a line memory away from the first read port. Accordingly, the values at the ports emulate the field and line memories.

The line doubler memory includes two sets of memories, each having two parallel line memories coupled in series to third and fourth line memories. The clock rates of the third and fourth line memory read ports are double that of each write port of the parallel line memories. The line doubler memory is emulated by a MPRB having two write ports and three read ports. The two write ports are positioned a line memory apart and the three read ports are positioned a line memory apart starting two line memories behind the write ports. The ports of the MPRB move in a special order to emulate the different clock speeds of the write and read ports.

The bandwidth consumed by the MPRBs is low enough to allow the MPRBs to be implemented in the external display memory of the graphics subsystem. However, a preferred embodiment of the present invention implements some of the MPRBs in the internal memory in order to increase system performance. Nevertheless, through the use of MPRBs, the bus width and bandwidth of the VDSP are reduced enough that the VDSP can be integrated into the rest of the graphics processing subsystem.

DETAILED DESCRIPTION OF THE PREFERRED EMBODIMENTS

Figure 1:
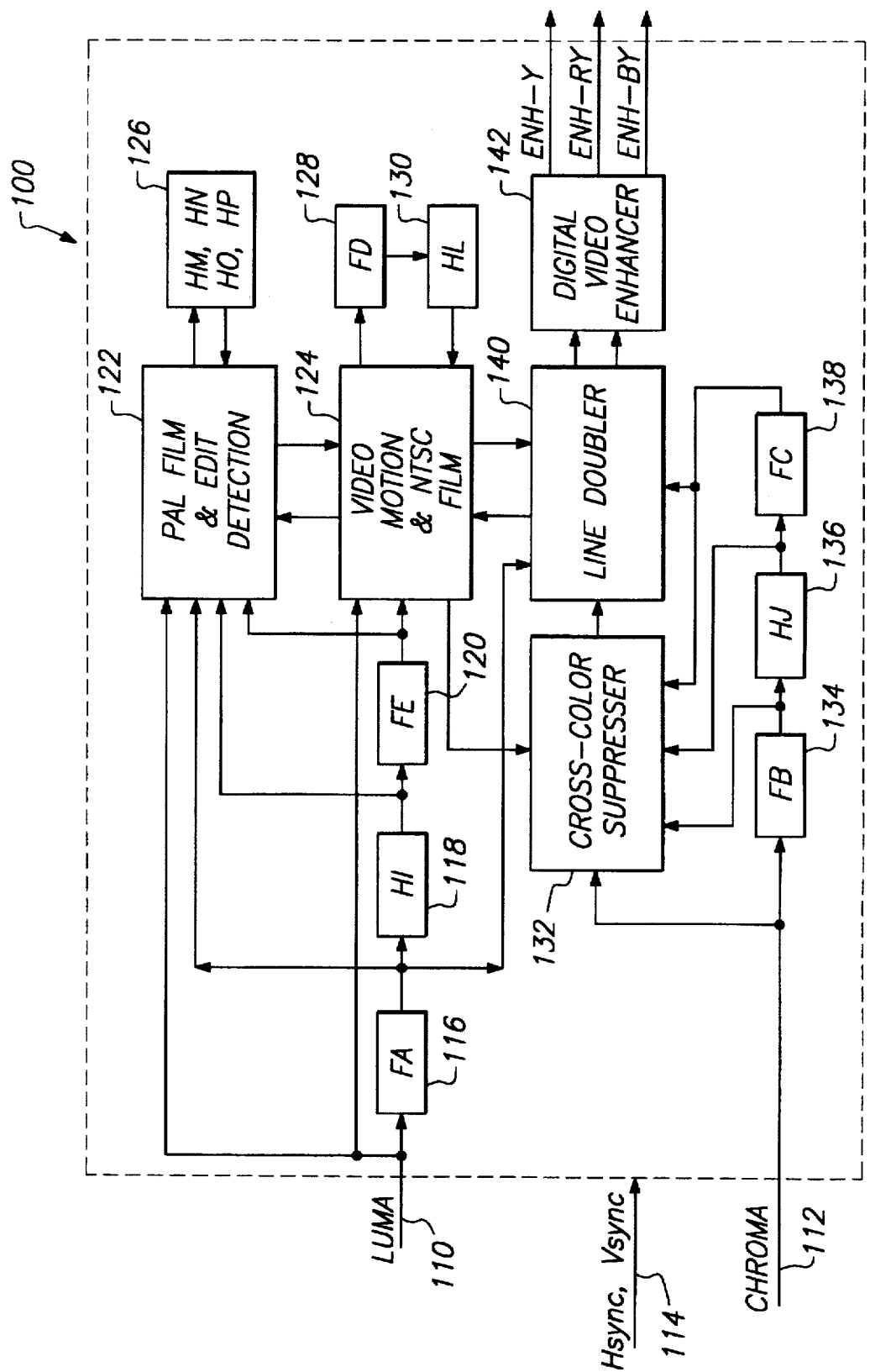
FIG. 1 is a high-level block diagram illustrating a prior art video digital signal processor (VDSP) having discrete field and line memories.

FIG. 1 is a high-level block diagram illustrating the functional units of a prior art video digital signal processing (VDSP) system 100 like the FAROUDJA VP250/LD200 VDSP manufactured by FAROUDJA LABORATORIES of Sunnyvale, Calif. The VDSP 100 accepts three inputs 110, 112,114. The first input 110 carries a digitized luminance (LUMA) signal, the second input 112 carries multiplexed digitized color difference (CHROMA) signals, and the third input 114 carries horizontal and vertical synchronization signals.

The LUMA signal 110 enters field memory FA 116, a phase alternation line (PAL) film and edit detection block 122, and a video motion and national television standard committee (NTSC) block 124. The output of field memory FA 116 passes to line memory HI 118, the PAL film and edit detection block 122, and a line doubler 140. The output of line memory HI 118 passes to field memory FE 120 and the PAL film and edit detection block 122. The output of field memory FE 120 passes to the PAL film and edit detection block 122 and the video motion and NTSC film block 124. The PAL film and edit detection block 122 and the video motion and NTSC film block 124 each pass an output to and receive an input from each other. In addition, the video motion and NTSC film block 124 passes an output to a cross color suppresser block 132 and the line doubler 140 and receives an input from the line doubler 140.

The multiplexed CHROMA signals 112 enter the cross color suppresser block 132 and field memory FB 134. Field memory FB 134 passes an output to line memory HJ 136 and the cross color suppresser block 132. Line memory HJ 136 passes an output to the cross color suppresser block 132 and field memory FC 138. The output of field memory FC 138 passes to the cross color suppresser block 132 and the line doubler 140. The cross color suppresser 132 passes an output to the line doubler 140, which, in turn, passes its output to a digital video enhancer 142.

The PAL film and edit detection block 122 uses four line memories 126 and detects film source signals in the PAL format and video edits in both formats. The video motion and NTSC block 124 uses one field memory FD 128 and one line memory HL 130 and performs video motion detection, detection of film source signals in the NTSC format, and determines the interpolated LUMA signal. The cross color suppresser block 132 performs fading frame averaging and line averaging dependent on the amount of motion present in the video signal. The line doubler 140 performs line doubling on the LUMA and CHROMA paths. The digital video enhancer 142 contains four line memories and enhances the image quality of the LUMA and CHROMA signals. These enhanced signals are output from the VDSP 100.

The VDSP 100 of FIG. 1 contains five field memories: FA 116, FB 134, FC 138, FD 128, and FE 120. Memories FA 116, FB 134, FC 138, and FE 120 each hold 312*910 8-bit data and memory FD 128 holds 312*910 4-bit data. The operating clock of each field memory is 13.5 MHz.

The VDSP 100 also contains the 17 line memories shown in Table 1.

TABLE 1

| Memory ID | Size | Write Clock | Read Clock |
| --- | --- | --- | --- |
| HA | 910 × 8 bits | 13.5 MHz | 27 MHz |
| HB | 910 × 8 bits | 13.5 MHz | 27 MHz |
| HC | 910 × 8 bits | 13.5 MHz | 27 MHz |
| HD | 910 × 8 bits | 13.5 MHz | 27 MHz |
| HE | 910 × 8 bits | 27 MHz | 27 MHz |
| HF | 910 × 8 bits | 27 MHz | 27 MHz |
| HG | 910 × 8 bits | 27 MHz | 27 MHz |
| HH | 910 × 8 bits | 27 MHz | 27 MHz |
| HI | 910 × 8 bits | 13.5 MHz | 13.5 MHz |
| HJ | 910 × 8 bits | 13.5 MHz | 13.5 MHz |
| HK | 910 × 8 bits | 13.5 MHz | 13.5 MHz |
| HL | 910 × 4 bits | 13.5 MHz | 13.5 MHz |
| HM | 910 × 7 bits | 13.5 MHz | 13.5 MHz |
| HN | 910 × 7 bits | 13.5 MHz | 13.5 MHz |
| HO | 910 × 16 bits | 13.5 MHz | 13.5 MHz |
| HP | 910 × 14 bits | 13.5 MHz | 13.5 MHz |
| HQ | 910 × 8 bits | 13.5 MHz | 13.5 MHz |

Memories FA 116, HI 118, and FE 120 form a LUMA memory and memories FB 134, HJ 136, and FC 138 form a CHROMA memory. In addition, memories FD 128 and HL 130 form a video motion memory. Line memories HA, HB, HC, and HD, located within the line doubler 140, and line memories HE, HF, HG, and HH, located within the digital video enhancer 142, form a line doubler memory. The remaining line memories, HK, HM, HN, HO, HP, and HK form a multiple line memory.

The total capacity of the line and field memories is approximately $312*910*4.5_{bytes}+910*(17+2)_{bytes}=1.29$ megabytes (MB). Each of the 22 discrete memories has one write port and one read port, making a total of 44 input/output (I/O) ports. The operating clock frequency of the five field memories and 13 of the line memories is 13.5 megahertz (MHz) and the remaining four line memories operate at 27 MHz. Thus, the total read/write memory bandwidth is approximately $(4.5_{bytes\ in\ field\ memories} + 15_{bytes\ in\ line\ memories} - 1_{byte\ of\ dummy\ bits\ in\ some\ line\ memories} + (4_{bytes} *2_{scale\ for\ 27\ MHz\ memories}))*2_{I/O\ ports}\ 13.5_{MHz} = 715.5$ MB/second (MB/s).

Figure 2:
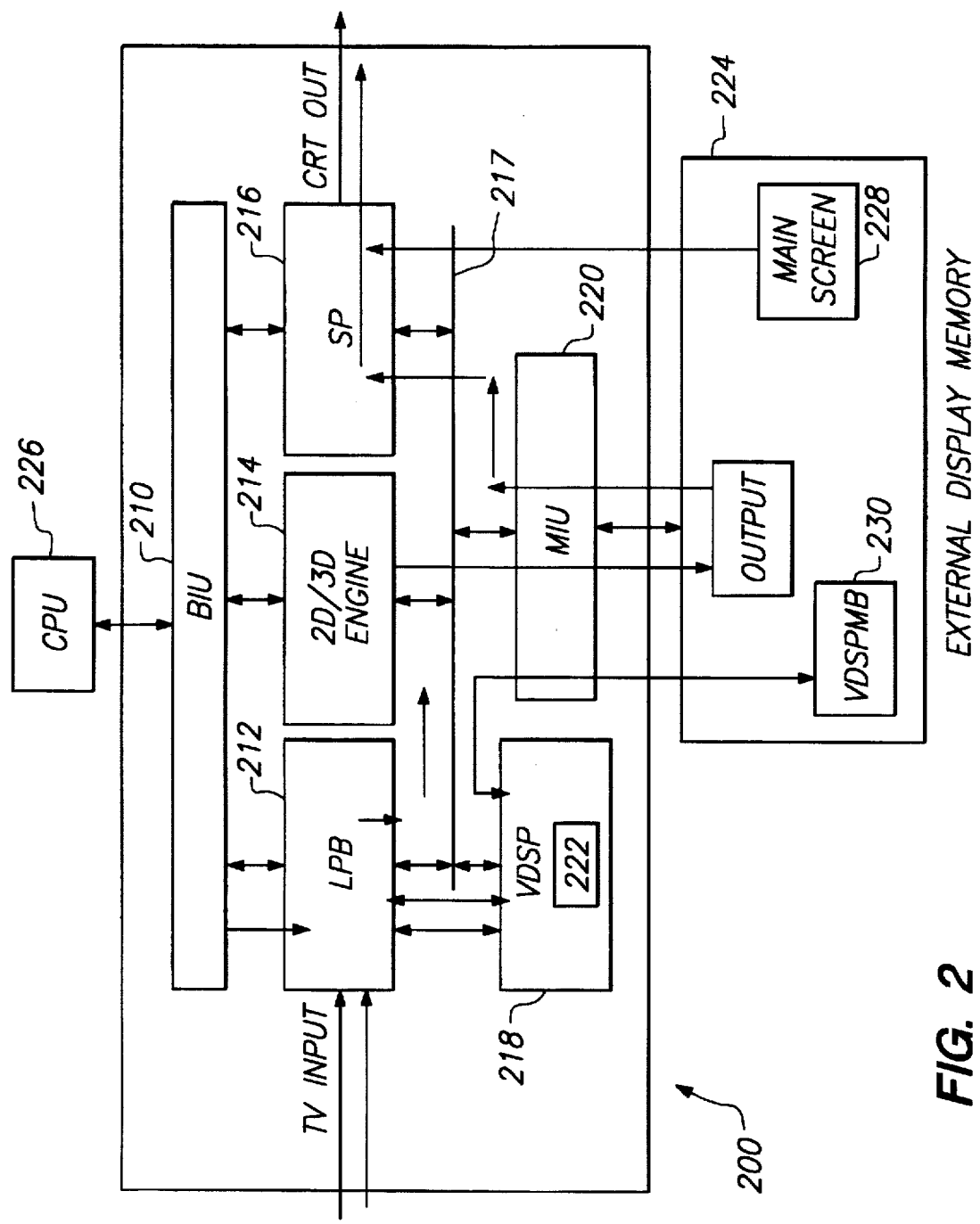
FIG. 2 is a high-level block diagram illustrating a graphics processing subsystem having a VDSP using multiple-port ring buffers (MPRBs) stored in an internal memory and an external display memory.

FIG. 2 is a high-level block diagram illustrating a graphics processing subsystem 200 of a computer system implementing a VDSP similar to that shown in FIG. 1. Shown are a bus interface unit (BIU) 210 coupled to a local peripheral bus 212 (LPB), a 2D/3D graphics engine 214, and a stream processor (SP) 216. The latter three devices 212,214,216 are coupled via a bus 217 to a memory interface unit (MIU) 220 coupled to an external display memory 224. A VDSP 218 is also coupled to the bus 217 and is directly coupled to the LPB 212 and the MIU 220.

The BIU 210 receives graphics commands and other information from a central processing unit (CPU) 226 of the computer system and receives digital video data retrieved from a storage device such as a hard drive or a digital video disk (DVD) (not shown). This received data is stored in the external display memory 224 after processing. The 2D/3D graphics engine 214 processes 2- and 3-dimensional graphics commands received via the BIU 210. The LPB 212 receives video data from one or more external video sources like television tuners, video cassette recorders, and video cameras (not shown). The video data is processed by the VDSP 218 and stored in the external display memory 224 via the MIU 220.

The MIU 220 controls data stores to and loads from the external display memory 224 and performs memory storage operations in response to commands from the other components in the graphics processing subsystem 200. The external display memory 224 is an addressable memory logically divided into separate memory spaces including the main screen memory 228 and the VDSP 218 memory buffer (VDSPMB) 230. Data written to the main screen memory 228 appear on the computer display (not shown). Accordingly, the main screen memory 228 is large enough to hold the data necessary to support the maximum resolution and color depth supported by the graphics processing subsystem 200. The VDSPMB 230 buffers memory used by the VDSP 218 during signal processing and preferably holds approximately one MB of data that emulates field and line memories used by the VDSP 218 as described below.

The stream processor 216 acts under the control of the 2D/3D engine 214 and the VDSP 218 to display graphics and video data on the display of the computer system. The stream processor 216 can read directly from the main screen memory 228 and can overlay the graphics and video data on the display.

Figure 3:
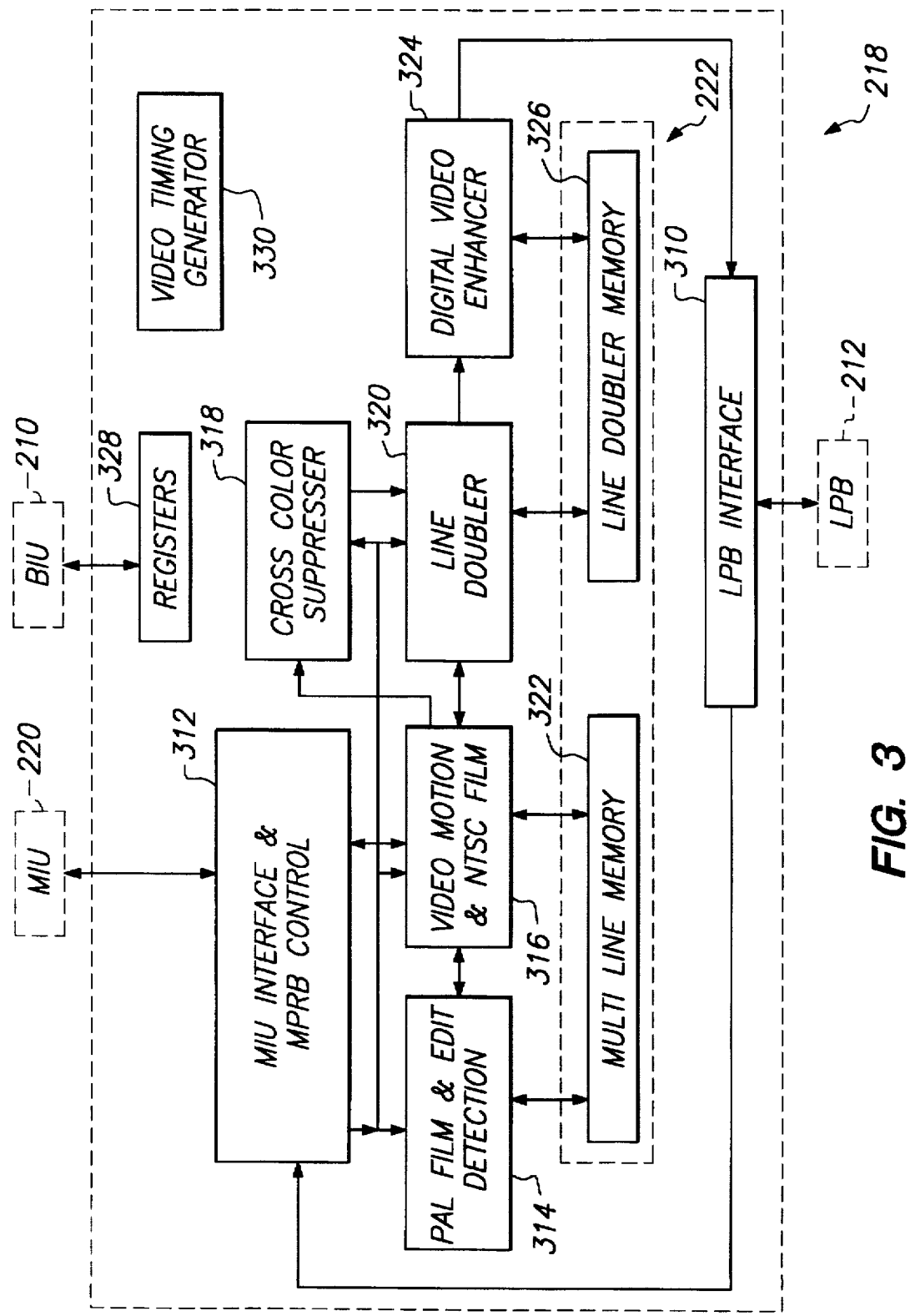
FIG. 3 is a high-level block diagram illustrating a preferred embodiment the VDSP of FIG. 2.

The VDSP 218 processes the video data received via the LPB 212 and is preferably a modified FAROUDJA VP250/ LD200 VDSP similar to that illustrated in FIG. 1. FIG. 3 is a high-level block diagram illustrating a preferred embodiment of the VDSP 218. Shown are a LPB interface 310 coupled to the LPB 212 of FIG. 2 and to a MIU interface and multiple-port ring buffer (MPRB) control 312. The MIU interface and MPRB control 312 is coupled to the MIU 220 of FIG. 2, a PAL film and edit detection block 314, a video motion and NTSC film block 316, a cross color suppresser 318, and a line doubler 320. The PAL film and edit detection block 314 and the video motion and NTSC film block 316 are coupled to a multiple line memory (MLM) 322 while the line doubler 320 and a digital video enhancer 326 are coupled to a line doubler memory 326. The BIU 210 of FIG. 2 is coupled to a plurality of registers 328 within the VDSP 218. In addition, the VDSP 218 has a video timing generator 330.

The LPB interface 310 receives video data from the LPB 212 and transfers the video data to the MIU interface and MPRB control 312. The MIU interface and MPRB control 312 interfaces with the MIU 220 to control loads and stores between the VDSP 218 and the external display memory 224 and manipulates and controls access to the MPRBs in the VDSPMB 230 as described below. The BIU 210 accesses the registers 328 within the VDSP 218 to determine and control the state of the VDSP 218. The video timing generator 330 generates timing signals which the VDSP 218 uses for synchronizing the operation of the various functional blocks described herein.

The LDM 326 holds approximately 8 KB of memory for emulating the discrete line doubler memories using MPRBs as described below. The MLM 322 holds approximately 6 KB of memory for emulating various memories used by the PAL film and edit detection block 314 and the video motion and NTSC film block 316 using a dual-port ring buffer. Together, the MLM 322 and the LDM 326 form the internal local memory 222 shown in FIG. 2. While the 14 line memories of the LDM 326 and MLM 322 could be emulated in the VDSPMB 230 like the other memories described below, a preferred embodiment of the VDSP 218 emulates the LDM 326 and MLM 322 internally in memory 222 in order to increase performance.

The PAL film and edit detection block 314, video motion and NTSC film block 316, line doubler 320, cross color suppresser 318, and digital video enhancer 314 perform essentially the same functions as described with respect to the corresponding blocks in FIG. 1. These blocks use the same line and field memories, including the LUMA, CHROMA, and video motion memories, as the VDSP 100 of FIG. 1. Rather than use discrete memories, however, the blocks of the VDSP 218 of FIG. 3 use MPRBs in the VDSPMB 230 to emulate the discrete memories.

FIG. 4 is a block diagram illustrating the LUMA and CHROMA memories of the VDSP 218 of FIG. 3. Since the VDSP 218 of FIG. 3 uses memories equivalent to those of the VDSP 100 in FIG. 1, memories illustrated in FIGS. 4–9 are identified with the corresponding reference numerals from FIG. 1.

Figure 4A:
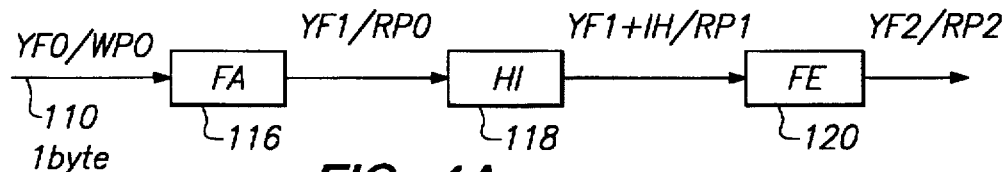
FIG. 4 comprised of FIG. 4a and 4b is a block diagram illustrating the LUMA and CHROMA memories of the VDSP of FIG. 3.
Figure 4B:
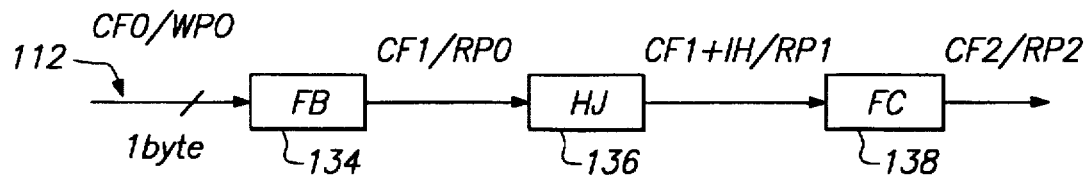

FIG. 4A illustrates the LUMA memory, including field memories FA 116 and FE 120 and line memory HI 118. FIG. 4B illustrates the CHROMA memory, including field memories FB 134 and FC 138 and line memory HJ 136. The labels on the write and read ports of the memories indicate: 1) the contents of the memories at a given instant in time; and 2) the identity of the write or read port. For example, the write port of field memory FA 116 is labeled "YF0/WP0" and the read port is labeled "YF1/RP0." The "YF1" label indicates that the data at the read port of FA 116 are one field ahead of the data at the write port "YF0." The "WP0" label indicates that the write port of FA 116 is write port zero and the "RP0" label indicates that the output of FA 116 is read port zero. The "Y" label indicates LUMA data while a "C" label indicates CHROMA data. Each port transfers one byte per clock cycle.

Implementing the memories of FIG. 4 as discrete memories requires one write port and one read port for each memory. Accordingly, the LUMA and CHROMA memories require a total of 12 ports. Since each of the ports operates on 8-bit data at 13.5 MHz, the total bandwidth required to implement the memories of FIG. 4 as discrete memories is $12_{ports}*13.5_{MHz}*1_{byte}=162$ MB/s. Most of this bandwidth is used merely to move data from one address to another.

Figure 5:
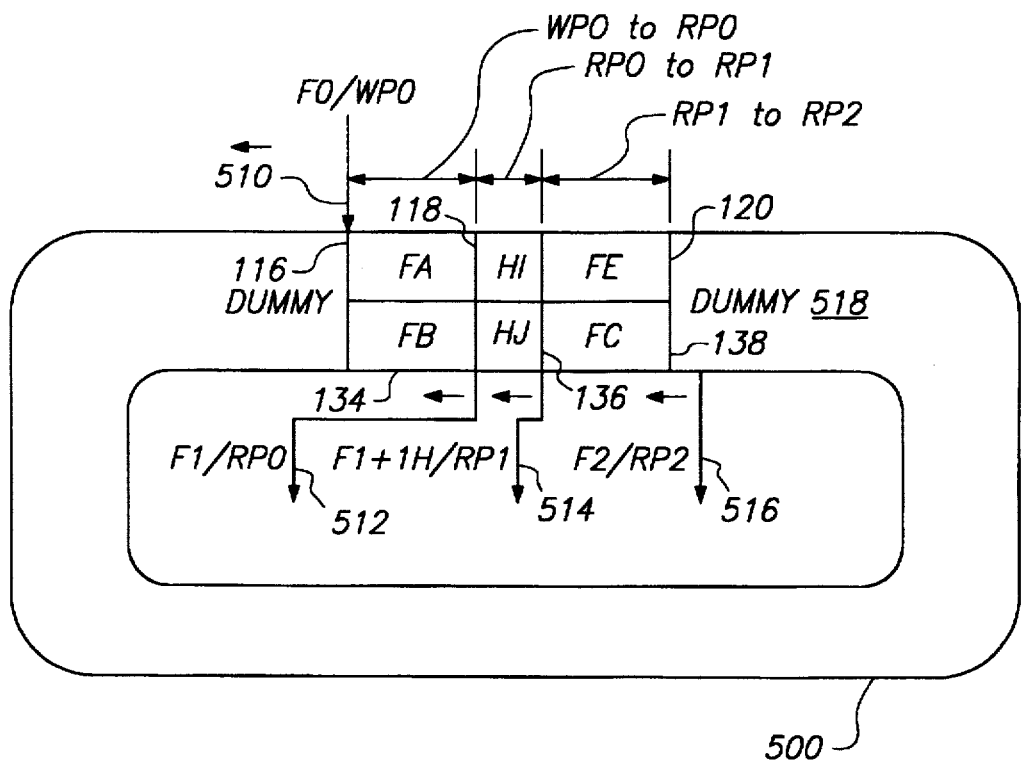
FIG. 5 is a diagram illustrating a MPRB implementing the LUMA and CHROMA memories of FIG. 4.

The present invention reduces the needed memory bandwidth between the VDSP 218 and the VDSPMB 228 by using MPRBs to reuse data without moving the data through the various discrete memories. FIG. 5 is a diagram illustrating a preferred MPRB 500 emulating the LUMA and CHROMA memories of FIG. 4. FIG. 5 shows a MPRB 500, a write port 510 labeled "F0/WP0," a first read port 512 labeled "F1/RP0," a second read port 514 labeled "F1+1H/RP1," and a third read port 516 labeled "F2/RP2." Defined within the MPRB 500 by the ports are memories FA 116, FB 134, HI 118, HJ 136, FE 120, FC 138, and a dummy area 518.

The MPRB 500 comprises of a plurality of addressable memory locations within the VDSPMB 230. Each memory location in the MPRB 500 preferably holds two bytes of video data, although this amount may vary and other MPRBs discussed herein hold different amounts of data at each address. A port writes to or reads from an address in the MPRB 500 and "moves around" the MPRB 500 by incrementing to the address of the next memory location in the MPRB 500. When the port increments past the last address in the MPRB 500, it loops back to the first memory address. Thus, the port traverses around the MPRB 500 as if the memory locations were linked in a ring. The MPRBs described herein are controlled by the MIU interface and MPRB control block 312 in the VDSP 218.

The write port 510 corresponds to the write ports YF0/WP0 110 and CF0/WP0 112 respectively shown in FIGS. 4A and 4B. The write port 510 preferably writes two bytes of video data at each address. One byte of data corresponds to the YF0 input 110 of FIG. 4A and the other byte corresponds to the CF0 input 112 of FIG. 4B. After the write port 510 writes the data, the write port increments to the next address in the MPRB 500. This write port movement is visualized by moving the arrow indicating write port 510 in FIG. 5 along the outside of the ring representing the MPRB 500.

Similar to the write port 510, read port F1/RP0 512 corresponds to the read ports YF1/RP0 and CF1/RP0 respectively shown in FIGS. 4A and 4B. The read port 512 preferably reads two bytes of data at each address where one byte of data corresponds to the YF1/RP0 read port of FIG. 4A and the other corresponds to the CF1/RP0 read port of FIG. 4B. Once the data are read, the read port 512 increments to the next address. The other two read ports 514,516 correspond to the like-labeled read ports in FIGS. 4A and 4B and operate in the same manner as the first read port 512.

A preferred embodiment of a graphics processing subsystem 200 according to the present invention reduces needed memory capacity and bandwidth by processing only active display timing and halt blanking timing within the video signal. Through this technique, horizontal active data fit into 728 clock cycles and vertical active line data fit in 288 lines. Display active timing is 80%, thereby allowing memory bandwidth to relax by 80%. Accordingly, the total memory bandwidth for the MPRB 500 is $4_{ports}*13.5_{MHz}*2_{bytes}*0.8=86.4$ MB/s.

The distance between the write port 510 address and a read port address defines a block of memory. In FIG. 5, the distance between the write port 510 and read port F1/RP0 512 defines a memory block equal to the combined size of field memory FA 116 and field memory FB 134, $288_{lines}*728_{clocks}*2_{bytes}=409.5$ KB. Similarly, the distance between read port F1/RP0 512 and read port F1+1H/RP1 514 defines a memory block equal to the combined size of line memories HI 118 and HJ 136, 728*2=1.42 KB. Also, the distance between read port F1+1H/RP1 514 and read port F2/RP2 516 defines a memory block equal to the combined size of field memories FE 120 and FC 138, 288*728*2= 409.5 KB. The 592-byte dummy area 518 aligns the MPRB 500 on a one KB memory boundary in order to simplify address comparisons when checking for the end of the buffer.

Figure 6:
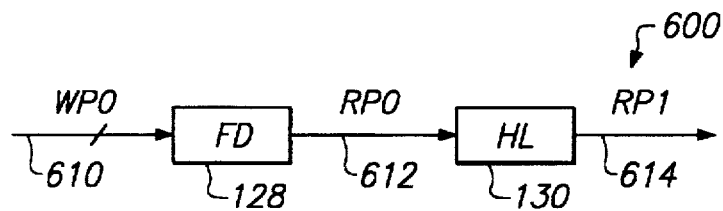
FIG. 6 is a block diagram illustrating the video motion memory of the VDSP of FIG. 3.

FIG. 6 is a block diagram illustrating the video motion memory (VMM) 600 of the VDSP 218. The VMM 600 comprises a field memory FD 128 and line memory HL 130 and has one write port WP0 610 and two read ports RP0 612, RP1 614. The write 610 and read ports 612,614 each operate on 4-bit data at a clock rate of 13.5 MHz.

Figure 7:
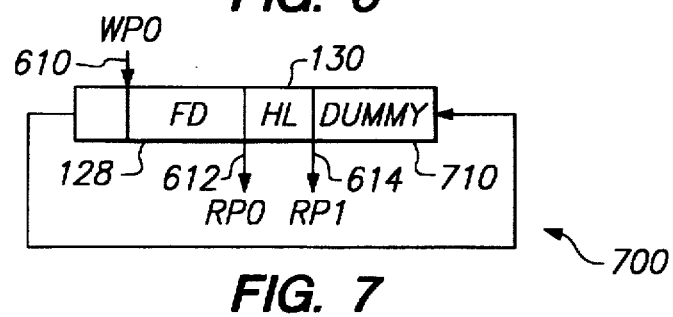
FIG. 7 is a diagram illustrating a MPRB implementing the video motion memory of FIG. 6.

FIG. 7 is a diagram illustrating a MPRB 700 emulating the VMM 600 of FIG. 6. MPRB 700 comprises write port WP0 610, read ports RP0 612 and RP1 614, field memory FD 128, line memory HL 130, and a dummy area 710. The MPRB 700 of FIG. 7 corresponds to the VMM 600 of FIG. 6 in the same manner as the MPRB 500 of FIG. 5 corresponds to the LUMA and CHROMA memories of FIGS. 4A and 4B.

The total memory bandwidth required for the MPRB 700 is $3_{ports}*13.5_{MHz}*0.5_{bytes}*0.8=16.2$ MB/s. The distance from WP0 610 to RP0 612 is $288_{lines}*728_{clocks}*0.5_{bytes}=$ 102.375 KB and the distance from RP0 612 to RP1 614 is 728*0.5=91*4 bytes. The dummy area 710 is 276 bytes and the total size of the MPRB 700 is 103 KB.

Figure 8A:
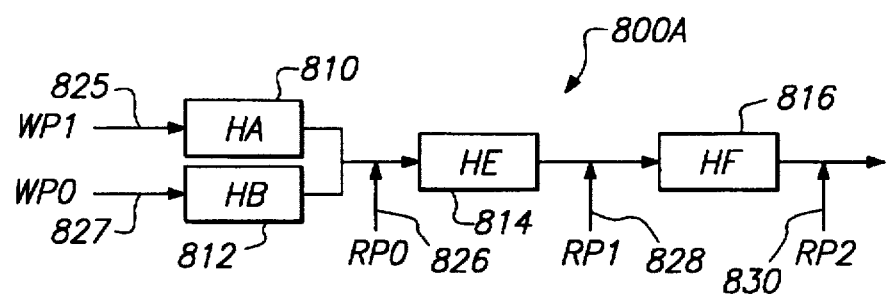
FIG. 8 made up of FIG. 8a and 8b is a block diagram illustrating the line doubler memory (LDM) of the VDSP of FIG. 3.
Figure 8B:
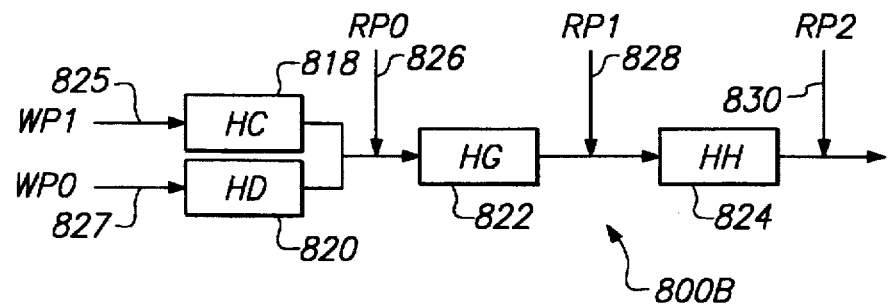

FIGS. 8A and 8B are block diagrams illustrating the LDM 326 held within internal local memory 222. The LDM 326 comprises two sets of line memories 800A,800B. The first set 800A contains line memories HA 810, HB 812, HE 814, and HF 816 and the second set 800B contains line memories HC 818, HD 820, HG 822 and HH 824. Memories HA 810 and HC 818 each have one write port WP1 825. Likewise, memories HB 812 and HC 818 each have one write port WP0 827. Each of the memory sets has three read ports RP0 826, RP1 828, and RP2 830.

As shown in Table 1, the write ports 825,827 of line memories HA 810, HB 812, HC 818, and HD 820 operate at 13.5 MHz and the read ports 826,828,830 operate at 27 MHz. Therefore, each read port 826,828,830 consumes data at twice the rate that data are produced by each write port 825,827.

Figure 9A:
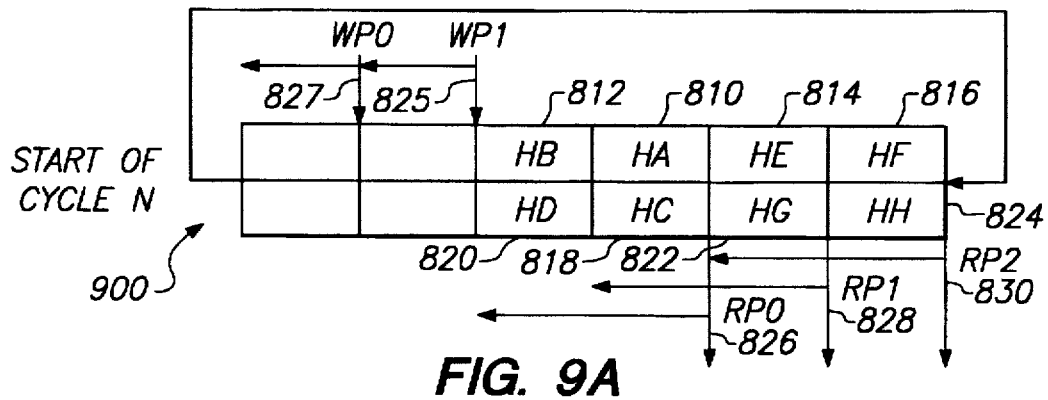
FIG. 9 made up of FIGS. 9a, 9b and 9c is a diagram illustrating the operation of a MPRB implementing the LDM of FIG. 8.
Figure 9B:
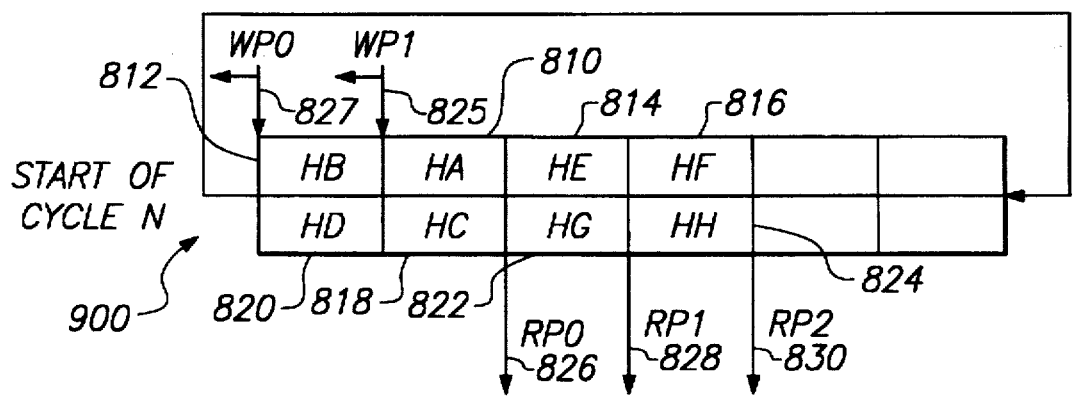
Figure 9C:
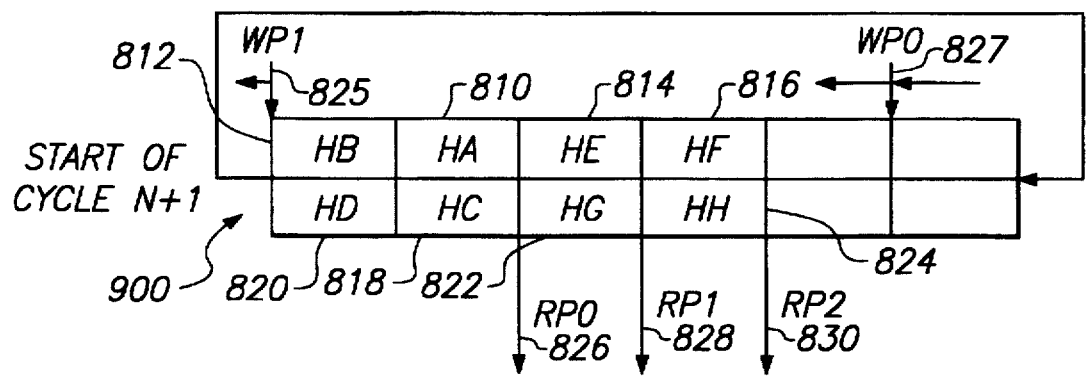

FIGS. 9A, 9B, and 9C illustrate a MPRB 900 emulating the LDM 326 shown in FIGS. 8A and 8B. The MPRB 900 of FIG. 9 corresponds to the LDM 326 of FIG. 3 in the same manner as the MPRB 500 of FIG. 5 corresponds to the LUMA and CHROMA memories of FIGS. 4A and 4B. Shown are write ports WP0 827 and WP1 825 and read ports RP0 826, RP1 828, and RP2 830. Within the MPRB 900 are line memories HA 810, HB 812, HC 818, HD 820, HE 814, HF 816, HG 822, and HH 824. The write ports write and the read ports read two bytes at each address in the MPRB 900. For example, RP0 826 in FIG. 9A reads from HA 810 and HC 818. In FIG. 9, the labels of the memory blocks within the MPRB 900 change to reflect the content of the data within that block. The memory at the address of RP0 826 in FIG. 9A is labeled HA 810 and HC 818 because, as shown in FIG. 8, RP0 826 reads those two line memories.

FIG. 9A illustrates the start of a memory cycle, FIG. 9B illustrates the end of the cycle, and FIG. 9C illustrates the start of the next cycle. At the start of the cycle, each write port 825,827 is positioned to write two bytes of data at its respective address. Each read port 826,828,830, in turn, is positioned to read two bytes of data from its respective address.

During the memory cycle, the write ports 825,827 write the data at each respective address. Then, the write ports 825,827 each increment to the next address. Since there are two write ports 825,827, four bytes of data are written in parallel during the cycle. Also during the memory cycle, each read port 826,828,830 reads the data at its respective address and increments to the next address. Then, each read port 826,828,830 again reads the data at its respective address and increments. Since there are three read ports 826,828,830, 12 bytes of data are read per memory cycle in two reads of six bytes each.

In FIG. 9B, the write ports have each incremented to the next address and the previously empty addresses in the MPRB 900 have been labeled HA 810, HC 818, HB 812, HD 820 to indicate that data were written at those addresses. Likewise, the read ports 826,828,830 have each incremented by two data addresses and the four addresses previously labeled HE 814, HF 816, HG 822, and HH 824 in FIG. 9A are now empty to indicate that the data at those addresses were consumed.

Between the end of the memory cycle and the start of the next cycle, the write ports each increment to the next address. This behavior is shown in FIG. 9C, in which the write ports 825,827 have each moved by one address from their respective positions in FIG. 9B. In this manner, the MPRB 900 simulates the behavior of the LDM 326.

The MPRB 900 has two write ports and three read ports and the total buffer area is 8 KB. The total memory bandwidth required for the MPRB 900 is $((2_{write\ ports}*2_{bytes})+(3_{read\ ports}*2_{bytes}*2_{reads}))*13.5_{MHz}*0.8=172.8$ MB/s. The distance from WP0 827 to WP1 825 is $728_{clocks}*2_{bytes}=91*16$bytes, the distance from WP1 825 to RP0 826 is $728_{clocks}*(2*2_{bytes})=91*32$ bytes, the distance from RP0 826 to RP1 828 is $728_{clocks}*2_{bytes}=91*16$ bytes, and the distance from RP1 828 to RP2 830 is $728_{clocks}*2_{bytes}=91*16$ bytes. The total size of the MPRB 900 is 8 KB and the dummy area is 912 bytes.

The MLM 322 within the internal local memory 222 of the VDSP 218 holds 6 KB and includes line memories HK, HM, HN, HO, HP, and HQ. These line memories are independent of each other and, accordingly, are best emulated by a dual-port ring buffer and need not be discussed in detail herein.

By using MPRBs to emulate the discrete field and line memories, the total memory capacity needed to implement the field and line memories of the VDSP 218 is reduced to only 938 KB. Of this total, 924 KB is external memory and 14 KB is internal local memory. More specifically, the LUMA and CHROMA memories and the VMM 600 respectively require 821 KB and 103 KB of external memory and the LDM 326 and MLM 322 respectively require 8 KB and 6 KB of internal local memory.

The total memory bandwidth needed to emulate the discrete line and field memories is 448.3 MB/s. Of this total, 102.6 MB/s is to the external memory while 345.6 MB/s is to the internal local memory. More specifically, the LUMA and CHROMA memories and the VMM 600 respectively require 86.4 MB/s and 16.2 MB/s of bandwidth to the external memory while the LDM 326 and MLM 322 each require of 172.8 MB/s of bandwidth to the internal local memory. Accordingly, the present invention allows the VDSP 218 to be implemented within a graphics subsystem 200 without using discrete field and line memories.

What is claimed is:

1. A graphics processing subsystem of a computer system, comprising:

a memory having a data structure adapted to emulate a plurality of discrete memories, the data structure comprising:

a plurality storage locations in a logical ring configuration for storing video data;

at least one write port adapted to move around the ring for writing video data to ones of the plurality of storage locations; and at least one read port adapted to move around the ring for reading the video data from ones of the plurality of storage locations;

wherein the data structure includes at least three ports selected from the at least one write port and the at least one read port and wherein a distance along the ring from the at least one write port to the at least one read port emulates the plurality of discrete memories; and a digital signal processor in communication with the memory for processing a video signal with the plurality of discrete memories emulated by the data structure contained therein.

2. The graphics processing subsystem of claim 1, wherein the memory is external to the digital signal processor.

3. The graphics processing subsystem of claim 1, wherein the memory is internal to the digital signal processor.

4. The graphics processing subsystem of claim 1, wherein the memory comprises:

an external memory external to the digital signal processor having a first instance of the data structure adapted to emulate a plurality of discrete memories; and an internal memory internal to the digital signal processor having a second instance of the data structure adapted to emulate a plurality of discrete memories;

wherein the digital signal processor is in communication with the external and internal memories and processes the video signal using the plurality of discrete memories emulated by the first and second instances of the data structures.

5. The graphics processing subsystem of claim 1, wherein the emulated plurality of discrete memories emulates a line memory for holding a line of video data.

6. The graphics processing subsystem of claim 1, wherein the emulated plurality of discrete memories emulates a field memory for holding a field of video data.

7. The graphics processing subsystem of claim 1, wherein the data structure is adapted to emulate a discrete memory having a read port operating at a higher frequency than a write port.

8. The graphics processing subsystem of claim 1, wherein the data structure is adapted to emulate a discrete memory having a read port and a write port operating at a same frequency.

9. A computer-readable memory comprising:

a plurality of memory locations for storing data at each location;

at least one write port adapted to move among the plurality of memory locations as if the plurality of memory locations were linked in a ring for writing data to particular memory locations in the ring; and at least one read port adapted to move among the plurality of memory locations as if the plurality of memory locations were linked in a ring for reading data from particular memory locations in the ring;

wherein the total computer-readable memory includes at least three ports selected from the at least one write port and the at least one read port.

10. The computer-readable memory of claim 9, wherein each memory location is adapted to store video data.

11. The computer-readable memory of claim 9, wherein the at least one write port advances to a next memory location in the ring after writing.

12. The computer-readable memory of claim 9, wherein the at least one read port advances to a next memory location in the ring after reading.

13. The computer-readable memory of claim 9, wherein a distance between the at least one write port and the at least one read port emulates a discrete memory.

14. The computer-readable memory of claim 13, wherein the distance between the at least one write port and the at least one read port emulates a plurality of discrete memories.

15. The computer-readable memory of claim 9, wherein the at least one write port is adapted to move at a different rate than the at least one read port.

16. A computer-implemented method for using memory locations located between starting and ending memory locations in a memory to emulate first and second discrete memories each having a write port and a read port, comprising the steps of:

writing data to a first memory location;

reading previously written data from a second memory location;

reading previously written data from a third memory location substantially contemporaneous with the reading of data from the second memory location;

incrementing the first, second, and third memory locations to respective subsequent memory locations in the memory, wherein the starting memory location is subsequent to the ending memory location; and wherein memory locations between the first memory location and the second memory location emulate the first discrete memory and memory locations between the second memory location and the third memory location emulate the second discrete memory.

17. The computer-implemented method of claim 16, wherein the first discrete memory is a line memory.

18. The computer-implemented method of claim 16, wherein the first discrete memory is a field memory.

19. The computer-implemented method of claim 16, wherein the incrementing step increments the first memory location a different amount that the second and third memory locations.

* * * * *